United States Patent
Mostafazadeh

(12) 
(10) Patent No.: US 6,740,961 B1
(45) Date of Patent: May 25, 2004

(54) LEAD FRAME DESIGN FOR CHIP SCALE PACKAGE

(75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/211,130

(22) Filed: Jul. 31, 2002

Related U.S. Application Data

(62) Division of application No. 09/590,551, filed on Jun. 9, 2000.

(51) Int. Cl.[7] .............................................. H01L 23/495
(52) U.S. Cl. ...................... 257/676; 257/666; 257/777; 257/786
(58) Field of Search ................................ 257/666, 676, 257/777, 786

(56) References Cited

U.S. PATENT DOCUMENTS

| | | | |
|---|---|---|---|
| 5,075,760 A | 12/1991 | Nakashima et al. | |
| 5,585,195 A | 12/1996 | Shimada | |
| 5,656,550 A | 8/1997 | Tsuji et al. | |
| 5,759,874 A | 6/1998 | Okawa | |
| 5,830,800 A | 11/1998 | Lin | |
| 5,847,458 A | 12/1998 | Nakamura et al. | |
| 5,866,948 A | * 2/1999 | Murakami et al. | 257/778 |
| 5,895,234 A | 4/1999 | Taniguchi et al. | |
| 5,923,080 A | 7/1999 | Chun | |
| 5,998,875 A | 12/1999 | Bodo et al. | |
| 6,034,422 A | 3/2000 | Horita et al. | |
| 6,100,594 A | 8/2000 | Fukui et al. | |
| 6,157,080 A | 12/2000 | Tamaki et al. | |
| 6,177,288 B1 | 1/2001 | Takiar | |
| 6,238,952 B1 | 5/2001 | Lin | |
| 6,247,229 B1 | 6/2001 | Glenn | |
| 6,255,740 B1 | 7/2001 | Tsuji et al. | |
| 6,258,626 B1 | 7/2001 | Wang et al. | |
| 6,261,864 B1 | 7/2001 | Jung et al. | |
| 6,306,684 B1 | 10/2001 | Richardson et al. | |
| 6,307,755 B1 | 10/2001 | Williams et al. | |
| 6,316,837 B1 | 11/2001 | Song | |
| 6,333,252 B1 | 12/2001 | Jung et al. | |
| 6,342,730 B1 | 1/2002 | Jung et al. | |
| 6,355,507 B1 | 3/2002 | Fanworth | |
| 6,358,778 B1 | 3/2002 | Shinohara | |
| 6,451,627 B1 | 9/2002 | Coffman | |

OTHER PUBLICATIONS

U.S. patent application No. 09/528,540, entitled "Leadless Packaging Process Using a Conductive Substrate", filed Mar. 20, 2000, inventor(s): Bayan et al.

U.S. patent application No. 09/698,784, entitled "Flip Chip Scale Package", filed Oct. 26, 2000, inventor(s): Shahram Mostafazadeh.

U.S. patent application No. 09/698,736, entitled "Chip Scale Pin Array", filed Oct. 26, 2000, inventor(s): Shahram Mostafazadeh.

U.S. patent application No. 09/054,422, entitled "Lead Frame Chip Scale Package", by Shahram Mostafazadeh et al., filed Apr. 2, 1998.

* cited by examiner

Primary Examiner—Tom Thomas
Assistant Examiner—N. Drew Richards
(74) Attorney, Agent, or Firm—Beyer Weaver & Thomas LLP

(57) ABSTRACT

A universal lead frame for mounting dice to form integrated circuit packages is provided. The lead frame may be made from a metal sheet, which may be stamped or etched. The lead frame provides a plurality of posts and a connecting sheet connecting the plurality of posts. Dice are adhesively mounted on to a first set of the plurality of posts. The dice are then electrically connected to a second set of the plurality of posts using wire bonding. An encapsulating material is placed over the dice and lead frame, with the connecting sheet keeping the encapsulating material on one side of the lead frame. The connecting sheet is then removed, leaving the posts as separate leads. The integrated circuits formed by the encapsulated dice and leads may be tested as a panel, before the integrated circuits are singulated.

21 Claims, 13 Drawing Sheets

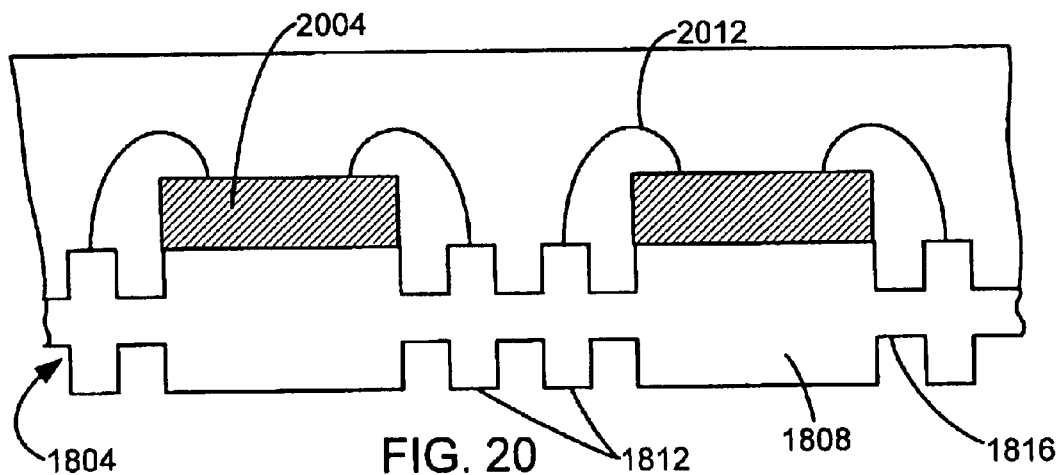
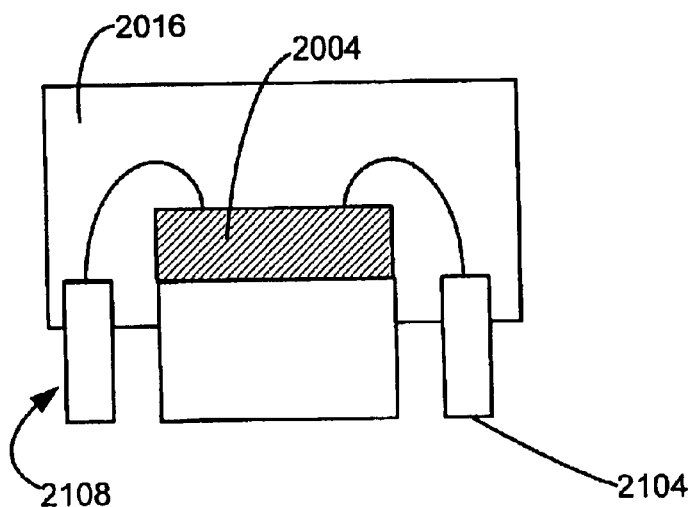
FIG. 21

LEAD FRAME DESIGN FOR CHIP SCALE PACKAGE

This application is Divisional of prior application Ser No. 09/590,551, filed on Jun. 9, 2000, from which priority under 35 U.S.C. §120 is claimed.

FIELD OF THE INVENTION

The present invention relates generally to integrated circuit packages. More specifically, the invention relates to lead frames for the production of chip scale integrated circuit packages.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution.

To facilitate discussion, FIG. 1 is a top view of a lead frame panel 100 made up for a plurality of lead frames that may be used in the prior art. The lead frame may comprise leads 108, die attach pads 112, ties 116 for supporting the die attach pads 112, and a skirt 120 for supporting the plurality of leads 108 and ties 116. The lead frame panel 100 may be etched or stamped from a thin sheet of metal. IC chips 124 may be mounted to the die attach pads 112 by an adhesive epoxy. Wire bonds 128, typically of fine gold wire, may then be added to electrically connect the IC chips 124 to the leads 108. Each IC chip 124 may then be encapsulated with part of the leads 108 and the die attach pad 112 in a protective casing, which may be produced by installing a preformed plastic or ceramic housing around each IC chip or by dispensing and molding a layer of encapsulation material over all IC chips 124. FIG. 2 is a cross-sectional view of part of the lead frame panel 100 and IC chips 124. In a process described in U.S. patent application Ser. No. 09/054,422, entitled "Lead Frame Chip Scale Package", by Shahram Mostafazadeh et al., filed Apr. 2, 1998, a tape 136 is placed across the bottom of the lead frame panel 100 and a dam 132 is placed around the lead frame panel 100. An encapsulation material 140 is poured to fill the dam 132, encapsulating the IC chips 124, the wire bonds 128, and part of the lead frame panel 100. The tape 136 prevents the encapsulation material 140 from passing through the lead frame panel 100. Once the encapsulation material 140 is hardened, the dam 132 and tape 136 may be removed. The encapsulation material 140 may be cut to singulate the IC chips 124 and leads 108.

It is desirable to provide an IC package process, which does not require the steps of adding tape to the lead frame and then removing the tape from the lead frame. It is also desirable to provide a process and lead frame that may accommodate various chip sizes and provides lead fingers.

SUMMARY OF THE INVENTION

To achieve the foregoing and other objects and in accordance with the purpose of the present invention, a variety of techniques is provided for packaging of integrated circuits. Generally, a conductive substrate formed from a conductive material is patterned to define a plurality of posts and a connecting sheet connecting the plurality of posts. Dice are physically mounted on a first portion of the plurality of posts, wherein each die is physically mounted on at least four posts. The dice are electrically connected to a second portion of the plurality of posts. A cap is molded over the plurality of dice and the patterned conductive substrate. The connecting sheet is then removed. Finally, integrated circuit packages are singulated.

Another aspect of the invention provides another method for packaging integrated circuits. Generally, a conductive substrate formed from a conductive material is patterned to define a plurality of posts and a connecting sheet connecting the plurality of posts. Dice are physically mounted on a first portion of the plurality of posts. The dice are electrically connected to a second portion of the plurality of posts. A cap is molded over the plurality of dice and the patterned conductive substrate. The posts are separated to form lead fingers from the separated plurality of posts.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 20 is a cross-sectional view of the part of the lead frame and dice after encapsulation.

FIG. 21 is a cross-sectional view of part of a resulting IC package.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
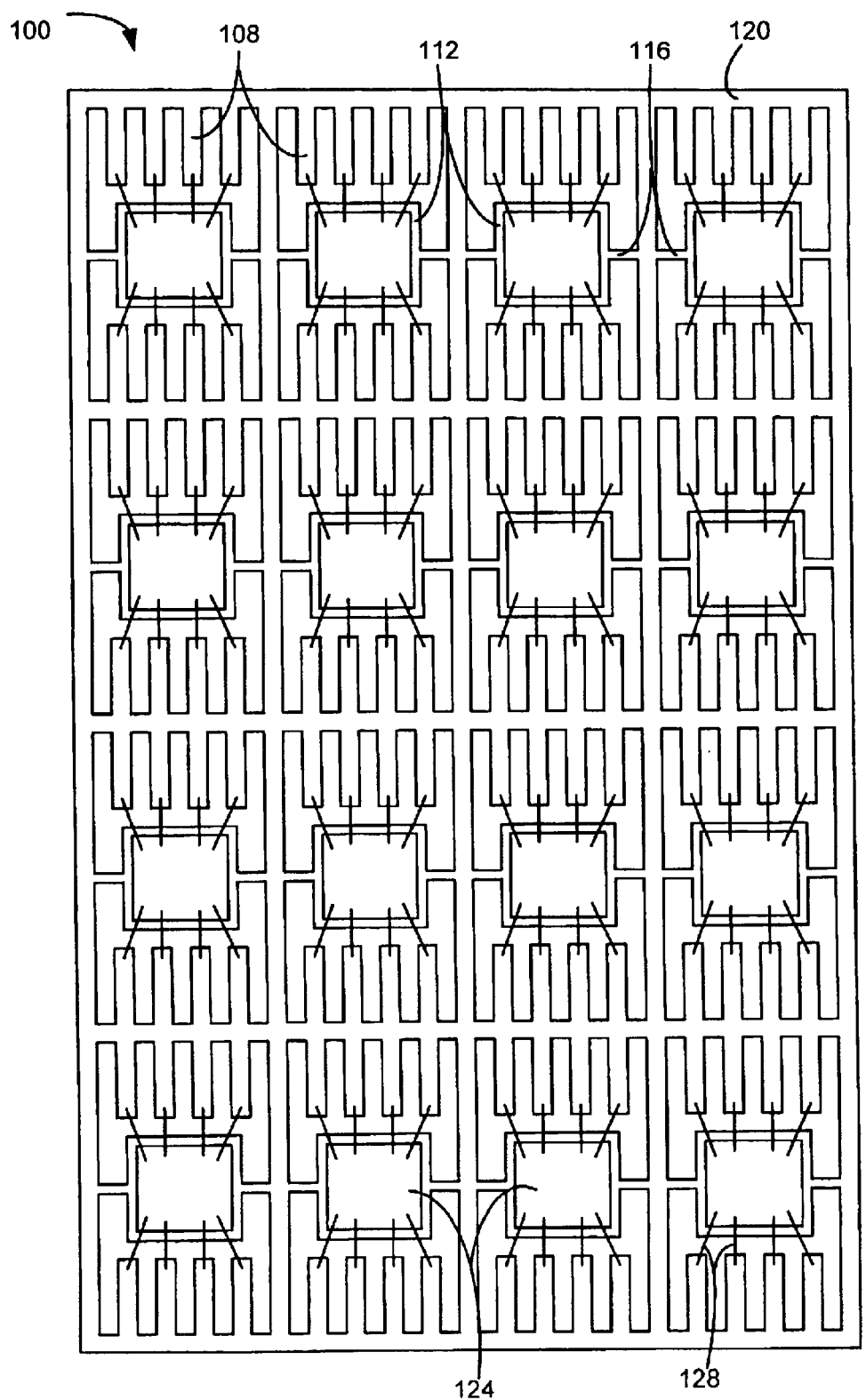
FIG. 1 is a plan view of a lead frame and die assembly used in the prior art.
Figure 2:
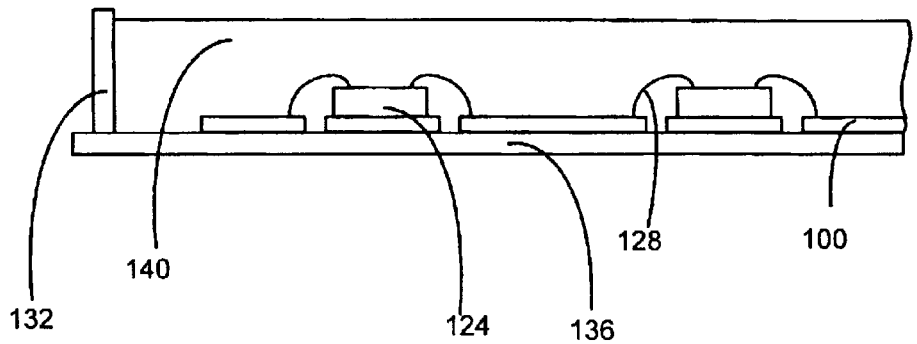
FIG. 2 is a cross-sectional view of part of the lead frame panel illustrated in FIG. 1.
Figure 4:
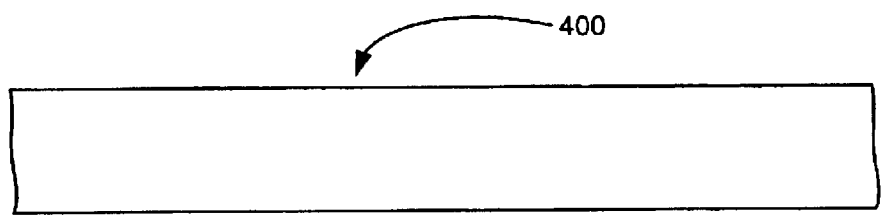
FIG. 4 is a cross-sectional view of part of a metal sheet before processing.
Figure 3:
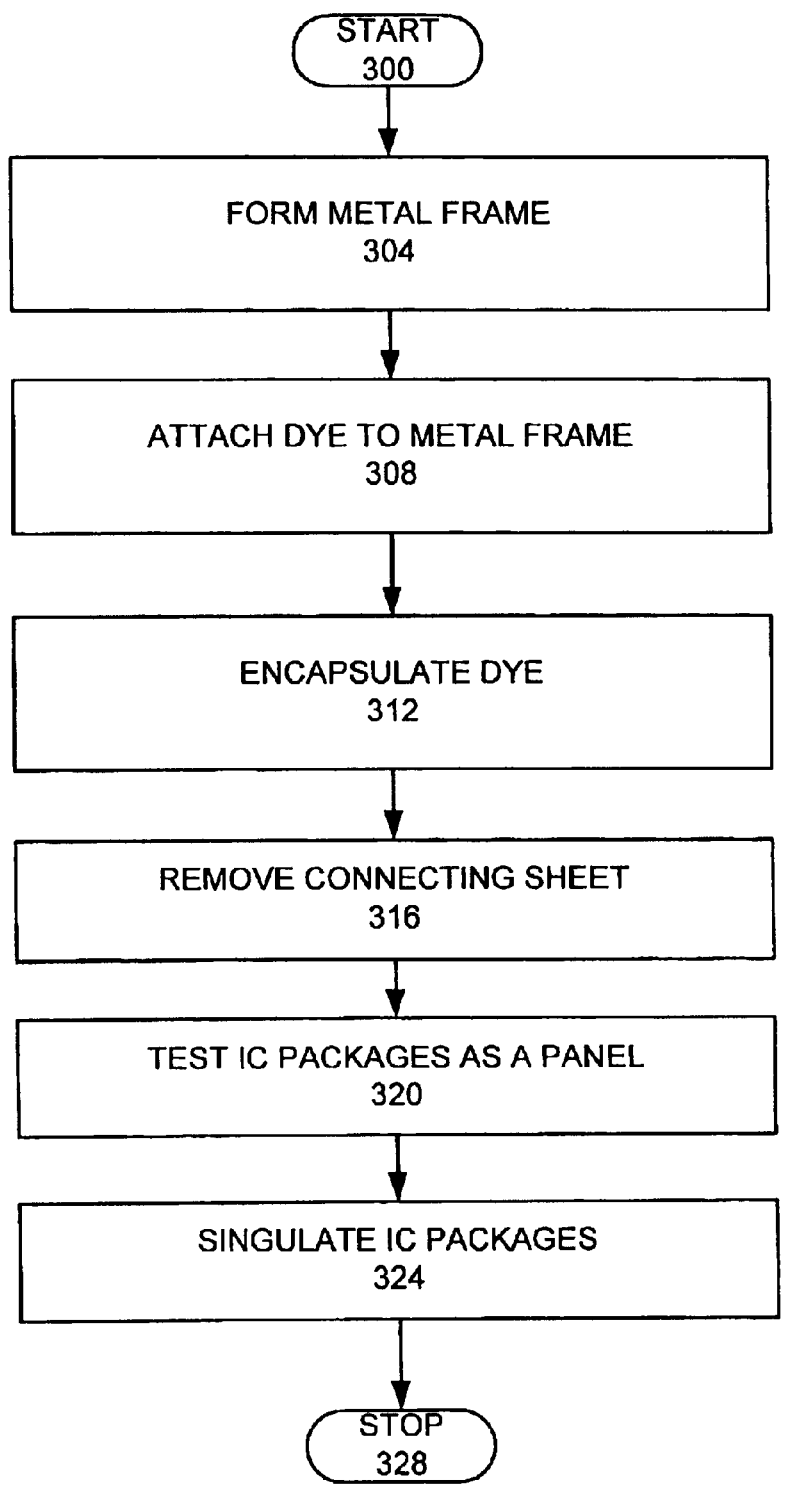
FIG. 3 is a flow chart of a process used in a preferred embodiment of the invention.
Figure 5:
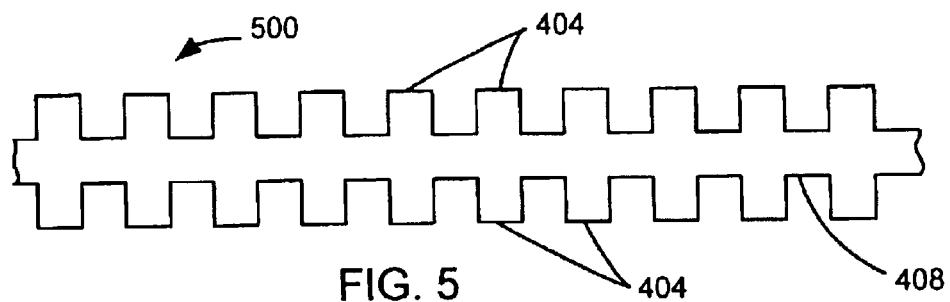
FIG. 5 is a cross-sectional view of the part of the metal sheet after it is processed into a lead frame.
Figure 6:
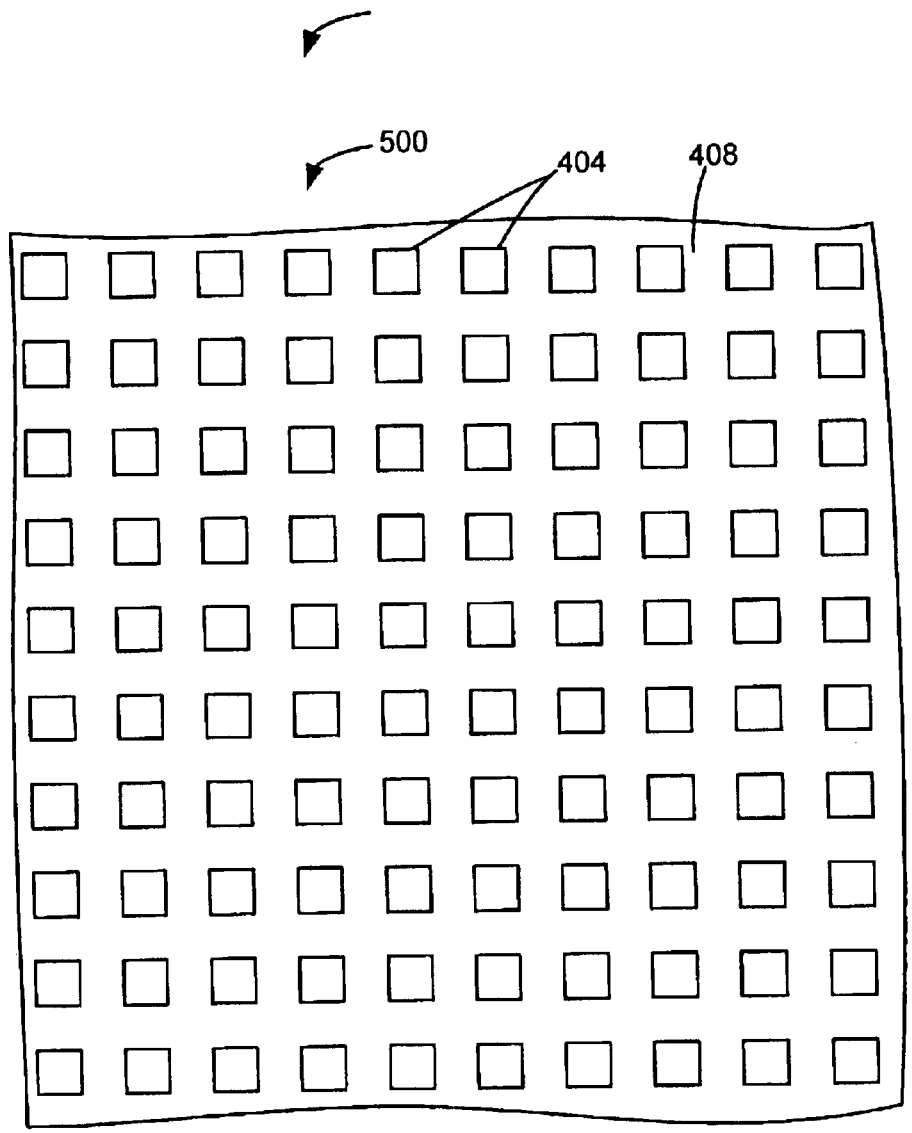
FIG. 6 is a top view of the part of the metal sheet shown in FIG. 5.

To facilitate discussion, FIG. 3 is a flow chart of a method used in a preferred embodiment of the invention. FIG. 4 is a cross-sectional view of part of a metal sheet 400 before processing. The metal sheet may have flat side surfaces. The metal sheet 400 is preferably copper, however other metallic materials, such as Alloy 42, may be used instead. The metal sheet 400 is processed so that the illustrated part of the metal sheet 400 forms part of a lead frame 500, which has the cross-sectional view as shown in FIG. 5. FIG. 6 is a top view of the part of the lead frame 500 shown in FIG. 5. The processing of the metal sheet 400 may be performed by stamping or etching or another type of forming step. The lead frame 500 provides a plurality of posts 404. In this embodiment, the posts 404 all have the same square cross-section. In addition, the posts 404 are spaced apart to form a square array. The square array is formed by aligning posts vertically and horizontally in columns and rows, so that the vertical spacing is equal to the horizontal spacing. As illustrated, in this embodiment a connecting sheet 408 extends through the center of the lead frame 500 so that the connecting sheet 408 extends through the centers of the posts 404. The connecting sheet 408 is imperforate in that it extends between the posts 404 without any apertures. Plating, such as silver plating, may be added to the lead frame 500 for wire bonding. Much of the packaging handling equipment is designed for handling lead frame strips, therefore the part of the lead frame shown may be a part of a lead frame strip. Alternatively, the part of the lead frame shown may be part of a square or rectangular panel.

Figure 7:
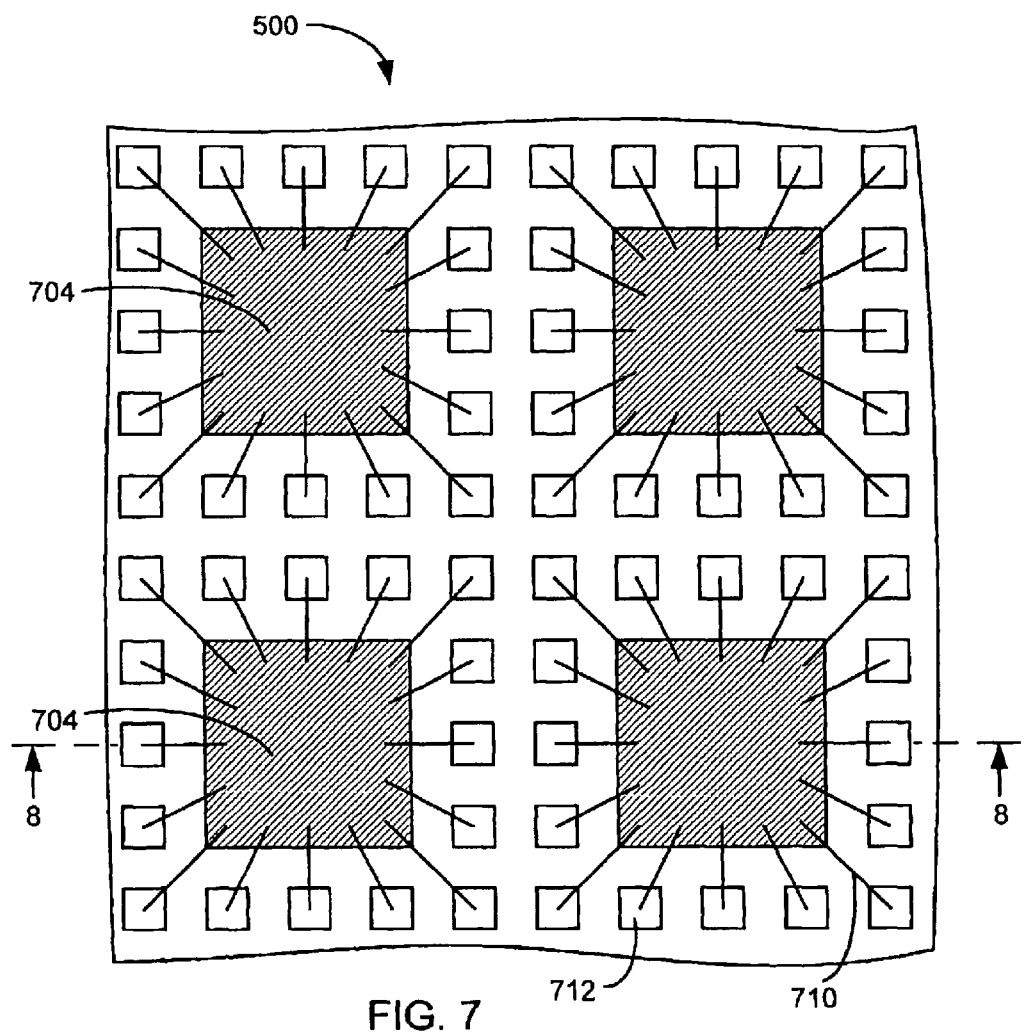
FIG. 7 is a top view of the part of the lead frame with a plurality of dies.
Figure 8:
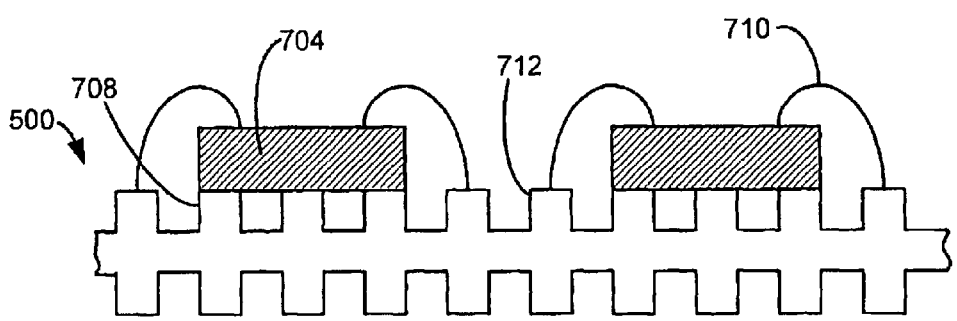
FIG. 8 is a cross-sectional view of FIG. 7 taken along lines 8—8.

A plurality of dice is then attached to the metal sheet (step 308). FIG. 7 is a top view of the part of the lead frame 500 with a plurality of dice 704 mounted thereon. An epoxy, tape, or other adhesive may be used to mount the dice to the lead frame 500. FIG. 8 is a cross-section taken along lines 8—8 of FIG. 7. The dice 704 are mounted on upper parts of a first set of posts 708. Wire bonding 710 may be used to electrically connect the dice 704 to a second set of posts 712. The wire bonding 710 may be created by gold ball bonding, which is known in the art. In this embodiment, the posts in the first set of posts 708 have the same size, shape, and spacing as the posts in the second set of posts 712.

Figure 9:
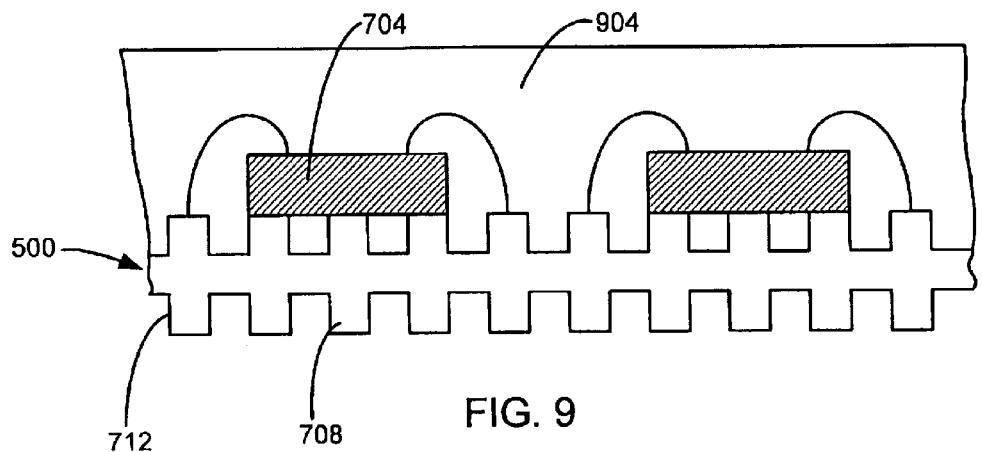
FIG. 9 is a cross-sectional view of the part of the lead frame and dice after encapsulation.

The dice 704 may then be encapsulated (step 312). Using conventional molding the lead frame 500 can be encapsulated by an encapsulation material 904, as shown in FIG. 9. If a dispensing method is used, then a dam may be placed around the lead frame 500. Since the connecting sheet 408 is imperforate in that it extends between the posts without any apertures, the connecting sheet prevents the encapsulation material from flowing under the lead frame 500, thus keeping the encapsulation material on one side of the lead frame 500. The encapsulation material may then be hardened and cured to form a cap. One cap may be used to cover the entire lead frame. In the alternative, several caps may be provided at various parts of the lead frame.

Figure 10:
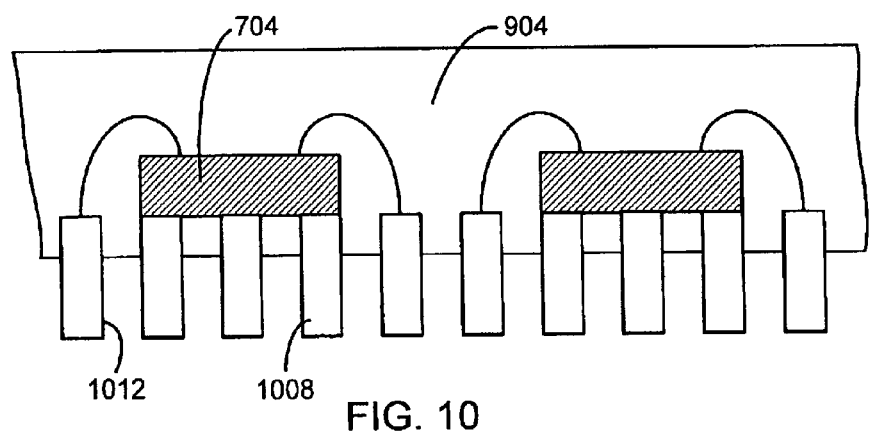
FIG. 10 is a cross-sectional view of part of the encapsulated lead frame and dice after the connecting sheet has been removed.
Figure 11:
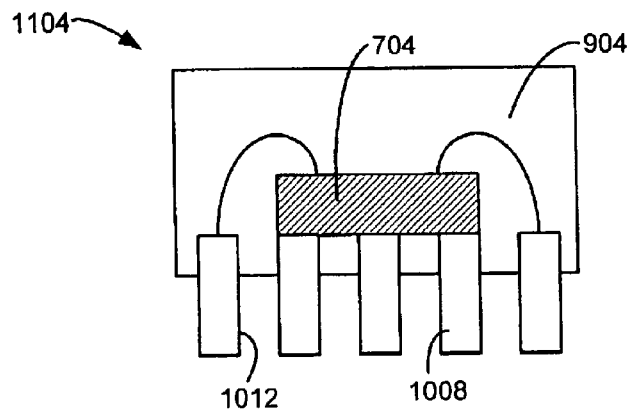
FIG. 11 is a cross-sectional view of a resulting chip scale IC package.

The lead frame, dice 704, and encapsulation material 904 may be mounted on sticky tape and then placed on a vacuum chuck of sawing equipment, which is known in the art. The sawing equipment may be used for removing the connecting sheet 408 (step 316). In such a removal process, the sawing equipment cuts through only the connecting sheet 408 between the plurality of posts 708, 712. The removal of the connecting sheet forms the first set of posts 708 into a first set of lead fingers 1008 and the second set of posts 712 into a second set of lead fingers 1012, which may be electrically isolated from each other, as shown in FIG. 10. Since the IC packages have not been singulated, the frame is in one piece held by the encapsulation material 904. This allows all IC packages to be tested in panel form (step 320), which allows faster and easier testing. After testing, the saw equipment may then be used to singulate the lead frame 500, dice 704, and encapsulation material 904 into individual IC packages (step 324). In such a singulation process, the sawing equipment cuts through the encapsulation material 904. FIG. 11 is a cross-sectional view of a chip scale IC package 1104 after singulation. The first set of lead fingers 1008 may provide thermal contacts to the die 704 to allow cooling or thermal regulation of the die 704. The second set of lead fingers 1012 provides electrical contacts to do die 704.

If panel testing is not desired, then the chip scale IC packages may be singulated before electrical testing. In such a case, singulation may be performed during the step of removing the connection sheet. In other embodiments, other methods besides using saw equipment, such as etching or laser cutting, may be used to remove the connection sheet and/or for singulation.

Figure 12:
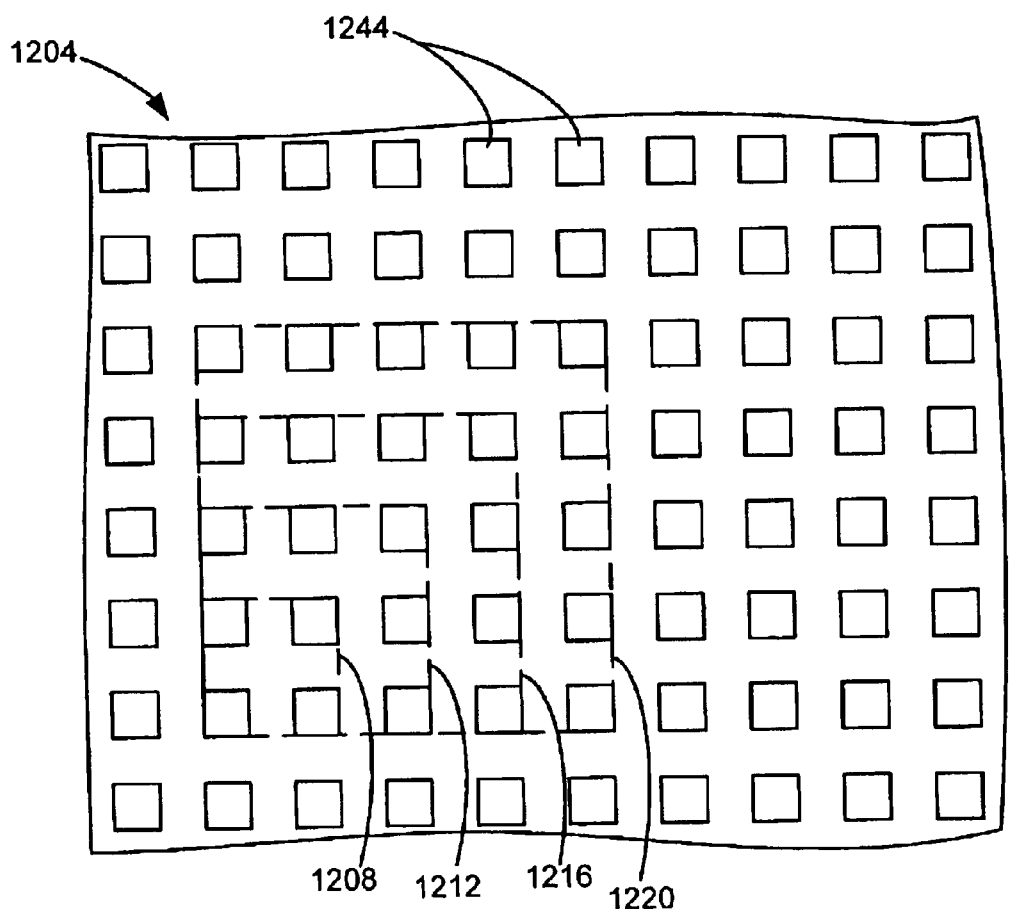
FIG. 12 is a top view of the lead frame, shown to accommodate different size dice.

FIG. 12 is a top view of part of a lead frame 1204, which illustrates how dice of different sizes and different input/output counts may be accommodated. A first size die 1208 may extend across two posts 1244 along a width and along a length. Twelve posts 1244 surrounding the periphery of the first size die 1208 may be used for electrical contacts, which may be made into leads. A second size die 1212 may extend across three posts 1244 along a width and along a length. Sixteen posts 1244 surrounding the periphery of the second size die 1212 may be used for electrical contacts, which may be made into leads. A third size die 1216 may extend across four posts 1244 along a width and along a length. Twenty posts 1244 surrounding the periphery of the third size die 1216 may be used for electrical contacts, which may be made into leads. A fourth size die 1220 may extend across five posts 1244 along a width and along a length. Twenty-four posts 1244 surrounding the periphery of the fourth size die 1220 may be used for electrical contacts, which may be made into leads. Even larger dice extending across more contacts may also be used. Rectangular dice of different sizes may also be accommodated by the lead frame. FIG. 12 illustrates that providing a pattern of posts in a square array provides a universal lead frame that may accommodate different size and shape dice. To best use the features of the lead frame, for rectangular dice, each die preferably is physically mounted on at least two posts. For square dice, each die preferably is physically mounted on at least four posts. If more contacts for higher pin counts are desired for a specified size die, a universal flame with a smaller pitch (distance between posts) may be used. Although the lead frame is universal, not being made for only one die size, the dice may be placed close together in a compact arrangement to minimize lead frame area per die. The uniform distance between posts allows for the universal lead frame. A uniform distance between posts in both width and length to provide a square array allows for a more preferable universal lead frame.

Figure 13:
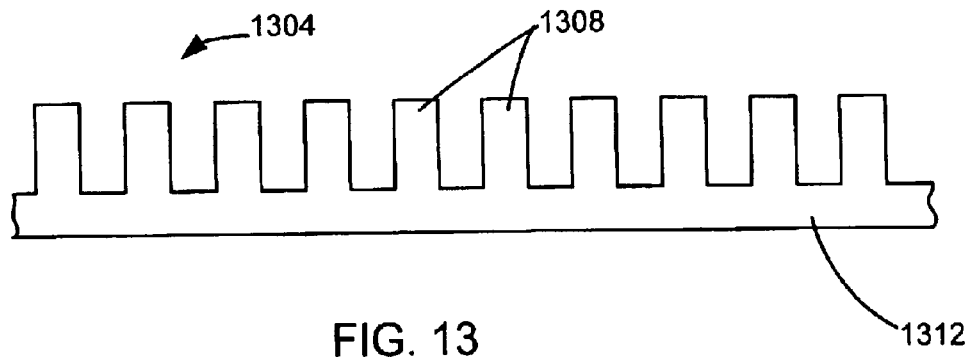
FIG. 13 is a cross-sectional view of a part of a lead frame used in another embodiment of the invention.
Figure 14:
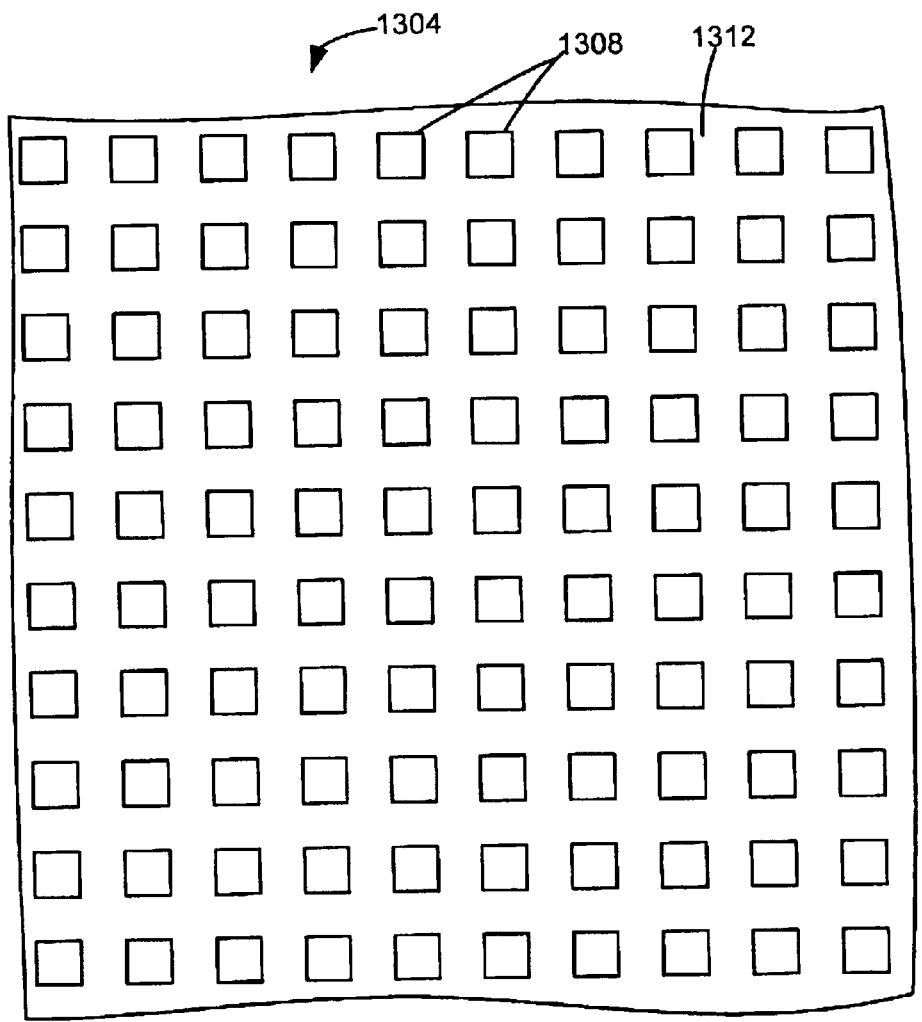
FIG. 14 is a top view of the part of the lead frame shown in FIG. 13.

In another embodiment of the invention, the metal may be processed on only a single side to form a lead frame. FIG. 13 is a cross-sectional view of part of a lead frame 1304 that has been etched on only one side. FIG. 14 is a top view of the part of the lead frame 1304 shown in FIG. 13. The lead frame 1304 comprises a plurality of posts 1308 and a connecting sheet 1312. In this embodiment, the connecting sheet 1312 extends along the bottom of the posts 1308, instead of through the centers of the posts as described in the previous embodiment. The lead frame 1304 may be formed by stamping, etching, or another type of process. As shown in FIG. 14, the posts 1308 are all of the same size and are in a square array. Such a square array places the posts in columns and rows where the columns are spaced evenly apart by a distance equal to the distance between rows so that the pitch between the columns equals the pitch between the rows.

Figure 15:
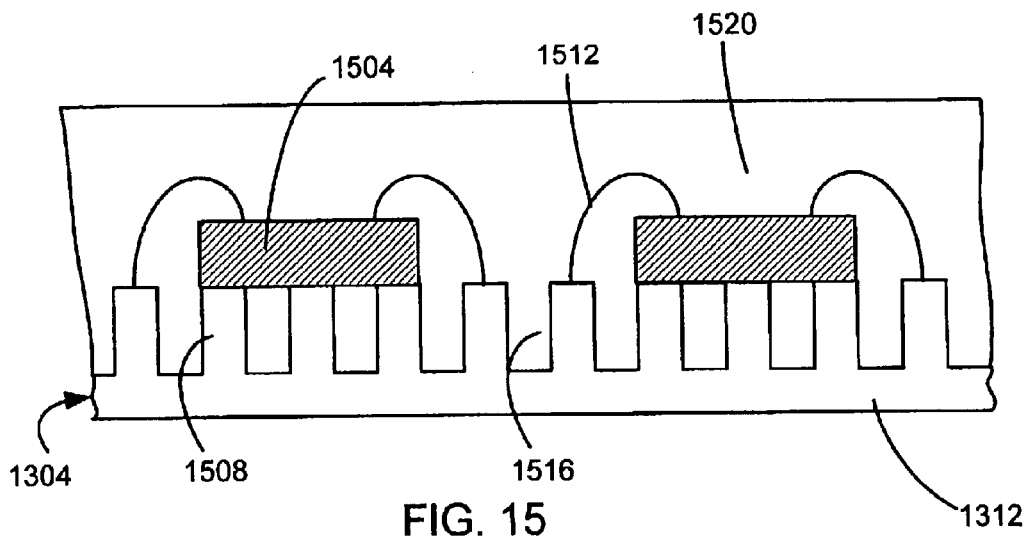
FIG. 15 is a cross-sectional view of the part of the lead frame and dice after encapsulation.

As with the previous embodiment, dice 1504 may be mounted on a first set of posts 1508, as shown in FIG. 15. An epoxy may be used to mount the dice to the first set of posts 1508. Wire bonding 1512 may be used to electrically connect the dice 1504 to a second set of posts 1516. The wire bonding 1512 may be created by gold ball bonding, which is known in the art. In this embodiment, the posts from the first set of posts 1508 have the same size, shape, and spacing as the posts from the second set of posts 1516.

The dice 1504 may then be encapsulated. Using conventional molding, the lead frame 1304 can be encapsulated by encapsulation material 1520. If a dispensing method is used, then a dam may be placed around the lead frame 1304. The connecting sheet 1312 helps to prevent the encapsulation material from flowing under the lead frame 1304, thus keeping the encapsulation material on one side of the lead frame 1304. The encapsulation material may then be hardened and cured to form a cap. One cap may be used to cover the entire lead frame. In the alternative, several caps may be provided at various parts of the lead frame.

Figure 16:
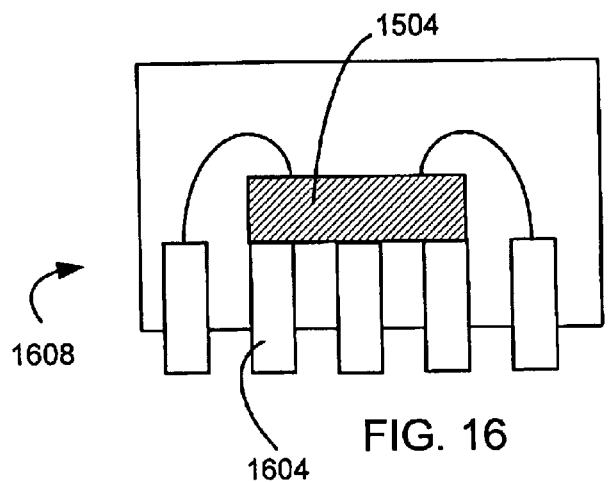
FIG. 16 is a cross-sectional view of part of a resulting IC package with leads.

The lead frame, dice 1504, and encapsulation material 1520 may be mounted on sticky tape and then placed on a vacuum chuck of sawing equipment, which is known in the art. The sawing equipment may be used for removing the connecting sheet 1312. In such a removal process, the sawing equipment cuts through only the connecting sheet 1312 between the posts 1308. The removal of the connecting sheet forms the posts 1308 into lead fingers 1604, which may be electrically isolated from each other, as shown in FIG. 16. If the IC packages have not been singulated, the frame is in one piece held by the encapsulation material 1520, which allows all IC packages to be tested in panel form. After testing, the saw equipment may then be used to singulate the lead frame 1304, dice 1504, and encapsulation material 1520 into individual IC packages 1608, as shown in FIG. 16. In such a singulation process, the sawing equipment cuts through the encapsulation material 1520.

The use of a saw to separate the posts provides the lead fingers 1604 or pins. Such lead fingers or pins are preferable.

Figure 17:
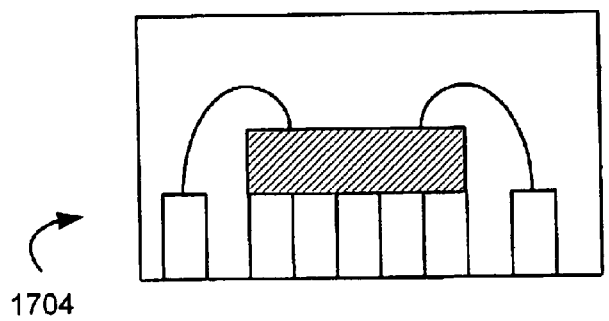
FIG. 17 is a cross-sectional view of an alternative resulting leadless chip scale IC package.

In the alternative, the connecting sheet may be thinned by etching, as described in U.S. patent application Ser. No. 09/528,540, entitled "Leadless Packaging Process Using a Conductive Substrate", by Bayan et al., filed Mar. 20, 2000, to provide a leadless IC package 1704, as shown in FIG. 17.

Since the lead frame 1304 has the same square array as described in the previous embodiment, the lead frame 1304 is a universal lead frame, which may accommodate dice of different sizes, as shown in FIG. 12.

In other embodiments, a universal lead frame with a square array of posts may have the posts in the square array closer together (a smaller distance and pitch between posts) to allow a higher number of contact posts for a particular die size. In another embodiment, a universal lead frame may have a rectangular array where the posts are arranged in columns and rows where the distance between (pitch of) the rows is different than the distance between the columns. Posts in other embodiments may be rectangular or have some other cross-section instead of having a square cross-section.

Figure 18:
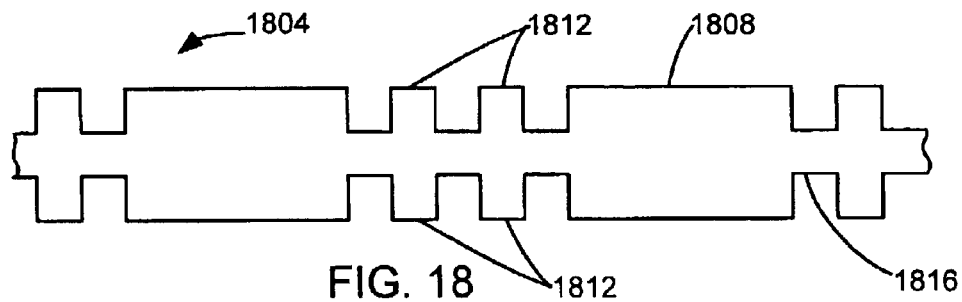
FIG. 18 is a cross-sectional view of a part of a lead frame used in another embodiment of the invention.
Figure 19:
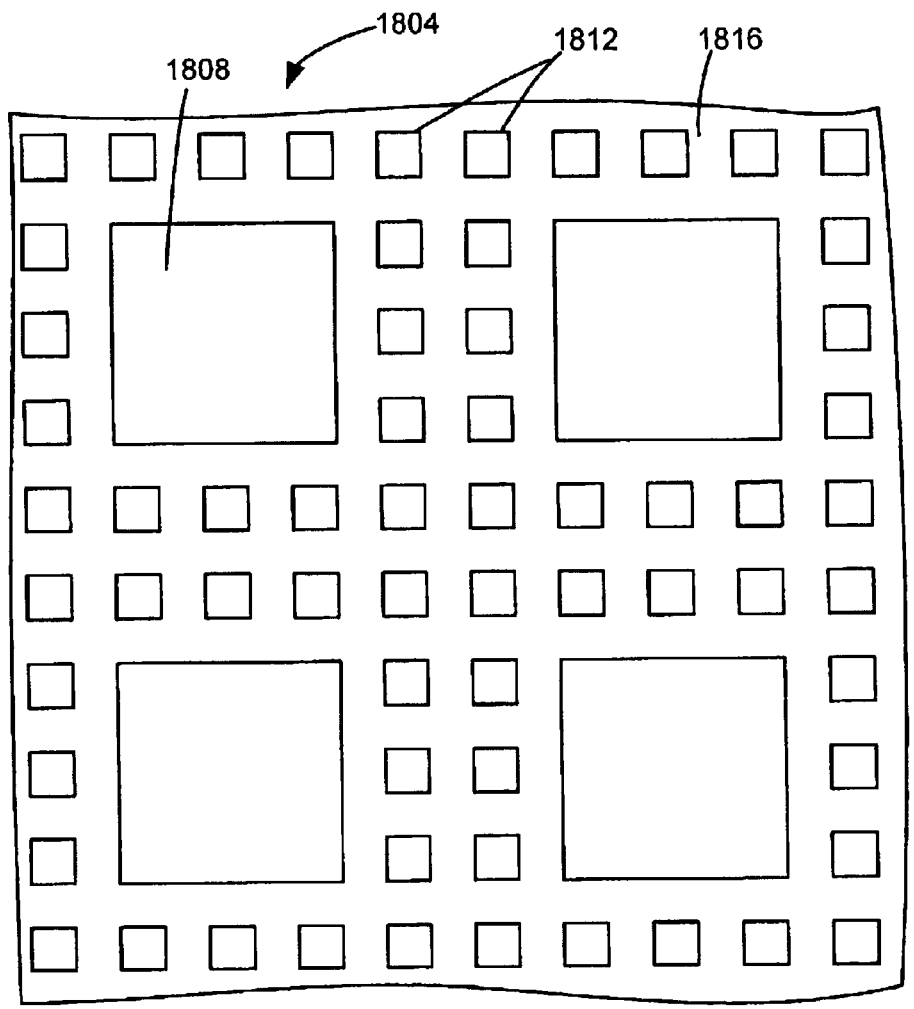
FIG. 19 is a top view of the part of the lead frame shown in FIG. 18.

FIG. 18 is a cross-sectional view of part of a lead frame 1804 provided in another embodiment of the invention. FIG. 19 is a top view of the part of the lead frame 1804. The lead frame 1804 comprises a plurality of posts which comprise a set of die attach pad posts 1808 and a set of connector posts 1812. The die attach pad posts 1808 have a cross-section that is several times wider than the cross-section of the connector posts 1812. Each die attach pad post 1808 is generally surrounded by connector posts 1812, with at least two rows of connector posts 1812 between the die attach pad posts 1808. Generally, the connector posts 1812 are formed in rows and columns. A connecting sheet 1816 extends through the center of the lead frame 1804 so that the connecting sheet 1816 extends through the centers of the die attach pad posts 1808 and connector posts 1812.

Dice 2004 may be mounted on the die attach pad posts 1808, as shown in FIG. 20. An epoxy may be used to mount the dice 2004 to the die attach pad posts 1808. Wire bonding 2012 may be used to electrically connect the dice 2004 to the connector posts 1812. The wire bonding 2012 may be created by gold ball bonding, which is known in the art.

The dice 2004 may then be encapsulated. Using conventional molding, the lead frame 1804 can be encapsulated by encapsulation material 2016. If a dispensing method is used, then a dam may be placed around the lead frame 1804. The connecting sheet 1816 helps to prevent the encapsulation material from flowing under the lead frame 1804, thus keeping the encapsulation material on one side of the lead frame 1804. The encapsulation material may then be hardened and cured to form a cap.

The lead frame, dice 2004, and encapsulation material 2016 may be mounted on sticky tape and then placed on a vacuum chuck of sawing equipment, which is known in the art. The sawing equipment may be used for removing the connecting sheet 1816. In such a removal process, the sawing equipment first cuts through only the connecting sheet 1816 to separate the connector posts 1812 and die attach posts 1808. The removal of the connecting sheet forms the connector posts 1812 and die attach posts 1808 into lead fingers 2104, which may be electrically isolated from each other, as shown in FIG. 21. Providing the die attach pad posts 1808 and connector posts 1812 into rows and columns so that there are straight paths of connecting sheet 1816 between the die attach pad posts 1808 and connector posts 1812 may provide for easier sawing and removal of the connecting sheet 1816. If the IC packages have not been singulated, the frame is in one piece held by the encapsulation material 2016, which allows all IC packages to be tested in panel form. After testing, the sawing equipment may then be used to singulate the lead frame 1804, dice 2004, and encapsulation material 2016 into individual IC packages 2108, as shown in FIG. 21. In such a singulation process, the sawing equipment cuts through the encapsulation material 2016.

In this embodiment, the lead frame is not universal, in that the die attach pad posts tend to limit the size of the die to be approximately equal to the cross-section of the die attach pad post. In this embodiment, the connecting sheet is used to prevent the encapsulating material from passing through the lead frame. In addition, the removal of the connecting sheet allows the formation of lead fingers.

Figure 22:
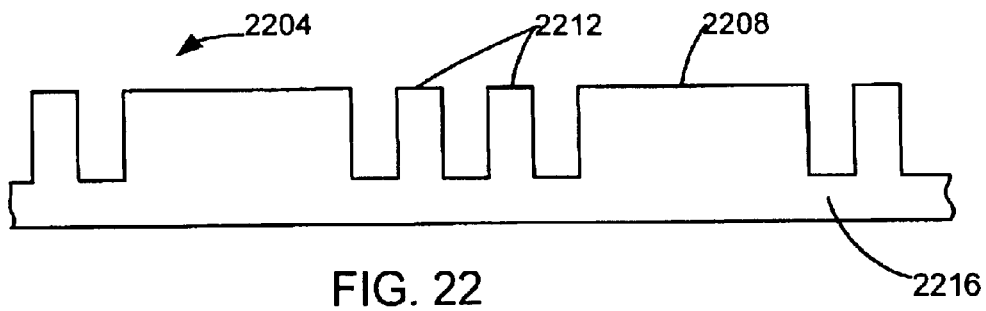
FIG. 22 is a cross-sectional view of a part of a lead frame used in another embodiment of the invention.
Figure 23:
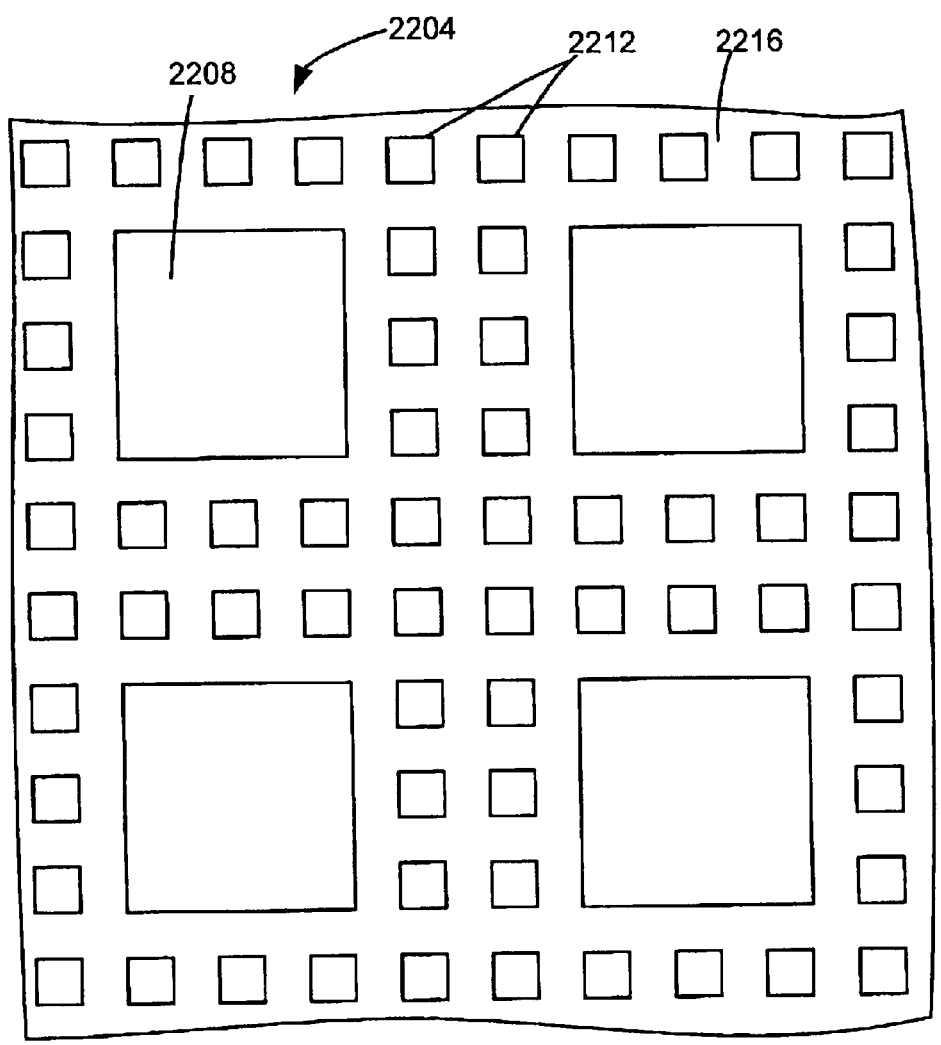
FIG. 23 is a top view of the part of the lead frame shown in FIG. 22.

In another embodiment of the invention, the metal sheet may be processed on only a single side to form a lead frame. FIG. 22 is a cross-sectional view of part of a lead frame 2204 provided in another embodiment of the invention. FIG. 23 is a top view of the part of the lead frame 2204. The lead frame 2204 comprises a plurality of posts which comprise a set of die attach pad posts 2208 and a set of connector posts 2212. The die attach pad posts 2208 have a cross-section that is several times wider than the cross-section of the connector posts 2212. Each die attach pad post 2208 is generally surrounded by connector posts 2212, with at least two rows of connector posts 2212 between the die attach pad posts 2208. Generally, the connector posts 2212 are formed in rows and columns. A connecting sheet 2216 extends along the bottom of the lead frame 2204 so that the connecting sheet 2216 along the bottoms of the die attach pad posts 2208 and connector posts 2212, instead of through the center as disclosed in the previous embodiment.

Figure 24:
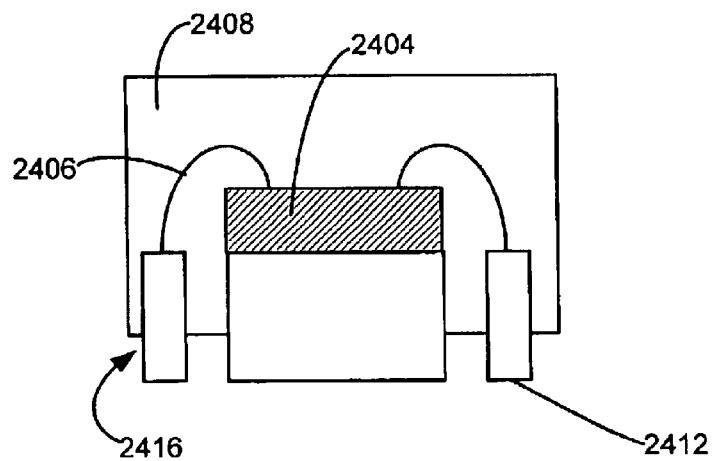
FIG. 24 is a cross-sectional view of part of a resulting IC package.

As in the previous embodiments, dice 2404, as shown in FIG. 24, may be adhesively mounted to the die attach pad posts 2208. Wire bonds 2406 are used to electrically connect the connector posts 2212 to the dice 2404. Using conventional molding the dice 2404 and the lead frame 2204 may be encapsulated by an encapsulating material 2408. A saw may be used to cut away the connecting sheet 2216 to form leads 2412 from the connector posts 2212 and die attach posts 2208, and may be used to singulate the dice 2404 to form integrated packages 2416.

Figure 25:
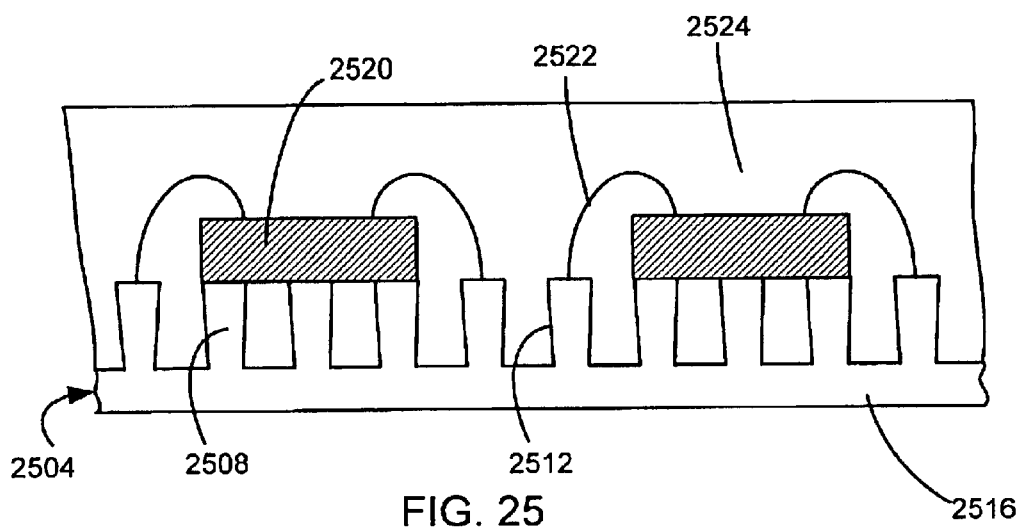
FIG. 25 is a cross-sectional view of the part of a locking lead frame and dice after encapsulation.

FIG. 25 is a cross-sectional view of part of a lead frame 2504 of another embodiment of the invention, which provides a plurality of posts 2508 with sloped sides 2512. The lead frame 2504 comprises a plurality of posts 2508 and a connecting sheet 2516. In this embodiment, the connecting sheet 2516 extends along the bottom of the posts 2508, but may extend through the centers of the posts. In this embodiment, the sloped sides 2512 of the plurality of posts 2508 may be formed by an etching process. Dice 2520 may be adhesively attached to some of the plurality of posts 2508. Wire bonds 2522 are used to electrically connect the dice 2520 to others of the plurality of posts 2508. Using conventional molding the dice 2520 and parts of the lead frame 2504 may be encapsulated by an encapsulating material 2524. The sloped sides 2512 help to lock the encapsulating material 2524 onto the lead frame 2504. The sloped sides 2512 for locking the encapsulating material 2524 onto the lead frame 2504 may take various forms. The sloped sides may be a straight slope, as shown in FIG. 25. The sloped sides may be curved. The main requirement in this embodiment is that the sloped sides provide locking posts so that the encapsulating material is locked onto the lead frame. Locking posts may be provided when part of a post is wider at a location than a part of the post lower down or that part of the gap between the posts is narrower at a location than a part of the gap lower down. The connecting sheet 2516 is removed and the IC packages are singulated as described in the previous embodiments.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An integrated circuit package, comprising:
   a plurality of leadframe posts, wherein each post has a first end and a second end, and wherein the first end of each post has a diameter that is larger than a diameter of the second end of each respective post;
   a die attach pad having a bottom surface that is substantially coplanar with the second ends of each of the plurality of posts, wherein the die attach pad and each of the posts have the same thickness;
   an integrated circuit chip having a first surface that is secured to the die attach pad and a second surface that is opposite from the first surface;
   a plurality of conductive wires connected between the second surface of the integrated circuit chip and the first end of each of the posts; and
   an encapsulating material cap surrounding at least a portion of the integrated circuit chip and at least a portion of the first ends of the plurality of posts such that the encapsulating material cap mechanically secures each of the plurality of posts in place, whereby the posts are substantially only held in place by the encapsulating material cap.

2. An integrated circuit package as recited in claim 1 wherein the integrated circuit package has a top surface and side surfaces wherein the top and side surfaces are perpendicular to each other.

3. A packaged semiconductor device comprising:
   a semiconductor die;
   a die attach pad having a top and a bottom surface, the semiconductor die being attached to the top surface of the die attach pad;
   a plurality of electrically conductive leadframe posts that surround the die attach pad, each of the posts having a top and bottom surface wherein the top surfaces of the posts are wirebonded to the semiconductor die, and wherein the top surface of each post has a diameter that is larger than a diameter of the bottom surface of each respective post, the bottom surfaces of the die attach pad and the posts being substantially coplanar, wherein the die attach pad and each of the posts have the same thickness; and
   a molding cap that encapsulates at least a portion of the semiconductor die, the die attach pad and the plurality of posts such that the molding cap mechanically secures each of the plurality of posts, whereby the posts are substantially only held in place by the molding cap.

4. A packaged semiconductor device as recited in claim 3 wherein at least two rows of posts surround the die attach pad.

5. A packaged semiconductor device as recited in claim 3 wherein the packaged semiconductor device has a top surface and side surfaces wherein the top and side surfaces are perpendicular to each other.

6. An integrated circuit package as recited in claim 1 wherein each of the posts has a longitudinal axis and the encapsulating material cap surrounds at least approximately one-half of each post in the longitudinal direction.

7. An integrated circuit package as recited in claim 3 wherein each of the posts has a longitudinal axis and the molding cap surrounds at least approximately one-half of each post in the longitudinal direction.

8. An integrated circuit package, comprising:
   a plurality of posts arranged in a uniform array of rows and columns wherein each post has a top end and a bottom end, and wherein the top end of each post has a diameter that is larger than a diameter of the bottom end of each respective post;
   an integrated circuit chip having a top surface and a bottom surface that is opposite from the top surface wherein the bottom surface of the integrated circuit chip is directly attached to at least some of the posts and wherein the top surface has a plurality of bonding pads;
   a plurality of conductive wires connecting selected bonding pads with the top ends of associated posts; and
   an encapsulating material cap surrounding at least a portion of the integrated circuit chip and at least a portion of the top ends of the plurality of posts such that the encapsulating material cap acting substantially alone physically secures each of the plurality of posts that are not directly attached to the integrated circuit chip in place.

9. An integrated circuit package as recited in claim 8 wherein the encapsulating material cap has a bottom surface and wherein the bottom ends of the plurality of posts are exposed through the bottom surface of the encapsulating material cap.

10. An integrated circuit package as recited in claim 8 wherein the bottom ends of the posts are substantially coplanar with the bottom surface of the encapsulating material cap.

11. An integrated circuit package as recited in claim 8 wherein each of the posts has a longitudinal axis and the encapsulating material cap surrounds at least approximately one-half of each post in the longitudinal direction.

12. An integrated circuit package as recited in claim 8 wherein each of the plurality of posts are leadframe posts.

13. A universal leadframe, comprising:
    a connecting sheet having a uniform two-dimensional array of electrically conductive posts arranged in rows and columns, the posts extending from the connecting sheet, the connecting sheet being suitably sized such that a plurality of semiconductor dice can be mounted onto at least some of the posts in a two-dimensional array with posts being exposed between each of the dice such that each die may be wirebonded to associated posts, each of the electrically conductive posts having a length that is substantially perpendicular to the connecting sheet, and wherein a first end of each of the posts has a cross-sectional area that is larger than a cross-sectional area of each respective post near the region where each respective post is connected to the connecting sheet; and
    a plurality of semiconductor dice that are directly attached to respective posts wherein the dice are arranged in a two-dimensional array with posts being exposed between each of the dice such that each die may be wirebonded to associated posts.

14. A universal leadframe as recited in claim 13 wherein the array of electrically conductive posts has at least 30 rows and 50 columns.

15. A universal leadframe as recited in claim 13 wherein the electrically conductive posts extend from a first side of the connecting sheet, the leadframe further comprising:
    a protective molding panel formed on the first side of the connecting sheet such that the protective molding panel encapsulates the electrically conductive posts.

16. A universal leadframe as recited in claim 13 further comprising:
    a mold panel that encapsulates at least a portion of each of the posts and each of the plurality of semiconductor dice.

17. A universal leadframe as recited in claim 13 wherein each semiconductor die has a top surface having a plurality of bonding pads, the bonding pads on each of the semiconductor dice are electrically connected to associated posts via associated bonding wires.

18. A universal leadframe as recited in claim 13 wherein each of the semiconductor dice are directly attached to at least four posts.

19. A universal leadframe as recited in claim 13 wherein each of the semiconductor dice are directly attached to a number of posts in the range of nine to twenty-five.

20. A universal leadframe as recited in claim 13 wherein at least a three by two array of semiconductor dice is mounted onto at least some of the posts.

21. A universal leadframe as recited in claim 13 wherein at least a five by five array of semiconductor dice is mounted onto at least some of the posts.

* * * * *